Sept. 18, 1973 R. SOLOMON 3,759,759
PUSH-PULL METHOD FOR SOLUTION EPITAXIAL GROWTH
OF III-V COMPOUNDS
Original Filed Jan. 29, 1970 4 Sheets-Sheet 1

United States Patent Office 3,759,759
Patented Sept. 18, 1973

3,759,759

PUSH-PULL METHOD FOR SOLUTION EPITAXIAL GROWTH OF III–V COMPOUNDS

Raymond Solomon, Sunnyvale, Calif., assignor to Fairchild Camera and Instrument Corporation, Mountain View, Calif.

Original application Jan. 29, 1970, Ser. No. 6,819, now Patent No. 3,664,294. Divided and this application Mar. 20, 1972, Ser. No. 235,997
Int. Cl. H01l 7/38
U.S. Cl. 148—171 11 Claims

ABSTRACT OF THE DISCLOSURE

Epitaxial layers of III–V compounds are grown on the facing surfaces of a pair of parallel, spaced-apart wafers by forcing a small quantity of a solution saturated with a III–V compound between the wafers for a selected time. Lowering the temperature of the solution precipitates the III–V compound epitaxially onto the adjacent surfaces of the wafers.

CROSS REFERENCE TO RELATED APPLICATION

This is a division of U.S. application Ser. No. 6,819, filed Jan. 29, 1970 on an invention of Raymond Solomon entitled "Push-Pull Structure and Method for Solution Epitaxial Growth of III–V Compounds," now U.S. Pat. 3,664,294, issued May 23, 1972.

BACKGROUND OF THE INVENTION

Field of the invention

This invention relates to the epitaxial growth of III–V compounds and in particular to the epitaxial, controlled growth of gallium arsenide or gallium phosphide in such a manner as to precisely control the thickness of the epitaxially-grown layer.

Prior art

Usually the Nelson Tilt Technique, described in volume 24 of the RCA Review, page 603 (1963), is used to grow epitaxial gallium arsenide or other gallium compounds from gallium solutions. To grow gallium arsenide by this technique, a gallium arsenide wafer is clamped at one end of a boat by means of a clamp, such as a spring clamp or a carbon screw. In the other end of the boat is placed a small quantity of gallium, typically on the order of 10 grams, together with a small piece of gallium arsenide, added to saturate the gallium which is molten at growth temperature of around 700–800° C. The boat is placed in a furnace. Once the melt is saturated at the growth temperature, the furnace is tilted so that the gallium flows over the wafer. At the same time, the furnace temperature is decreased at a programmed rate, usually about 10° C. per hour. As the temperature decreases, the gallium arsenide in solution becomes super-saturated and precipitates epitaxially onto the wafer.

The Nelson Tilt Technique has several disadvantages. First, it requires a movable, tiltable furnace.

Second, because of surface tension, the molten gallium containing the saturated gallium arsenide varies from very thin at the edge of the gallium arsenide wafer to very thick at the middle of the wafer. Since the temperature of gallium on the wafer is influenced by gas steaming over its surface, the thermal gradients in the gallium are non-uniform resulting in rough epitaxial surfaces on the wafer and poor electrical characteristics in the resulting epitaxially-grown layer.

Third, the spring clamp or screw severely distorts the adjacent growth of the epitaxial layer. This distortion extends over a large fraction of the wafer's surface area.

This distortion, together with the distortion due to the variable thickness of the gallium on the wafer, results in at least 50% of the surface area of the epitaxially-grown layer being unusable.

A final disadvantage of the Nelson Tilt Technique is that once the furnace is tilted and the temperature begins to decrease, the gallium will not easily flow off the gallium arsenide wafer. Thus the epitaxial growth process, once started, cannot be stopped until all the gallium arsenide in solution precipitates out onto the gallium arsenide wafer. Consequently, once growth starts, growth continues from the starting temperature, typically 700° C., down to a temperature where the growth ceases, typically 500° C. With the commonly used 10° C. per hour drop in temperature, epitaxial growth runs are about 20 hours long. Furthermore, if the gallium arsenide epitaxial layer is being simultaneously doped, the segregation coefficients of the impurities in the liquid gallium are strong functions of temperature. Conseqeuntly, the resulting epitaxial layer contains impurity gradients resulting from this temperature dependence of the segregation coefficient.

Thus, the Nelson Tilt furnace, while suitable for certain types of epitaxial growth processes, is not suitable for growth of precisely-controlled, thin, epitaxial layers.

A second technique of epitaxially growing gallium compounds is called the "vertical dip" technique. To grow gallium arsenide epitaxially using this technique, the gallium melt, containing gallium arsenide in solution, is held in a crucible. A gallium arsenide wafer, held vertically, is dipped into the gallium melt, held there for a selected time proportional to the thickness of the desired epitaxial layers to be grown on the two faces of the wafer, and then removed. Although conceptually simple, this technique also has problems.

One is that the electrical characteristics of the epitaxially-grown layers are of poorer quality than the similar characteristics of the epitaxial layers grown by the Nelson Tilt Technique. Furthermore, gallium globs stick to the surface of the wafer as the wafer is removed from the molten gallium and thus cause uneven growth spots on the wafer surface. Also, control over the epitaxial layers' thicknesses is very poor because of convection currents in the large volume of gallium in the crucible. These convection currents vary the concentration of impurities in the gallium and consequently result in uneven and graded impurity concentrations in the resulting epitaxially-grown layers on the wafer. Indeed, the gallium arsenide concentration is usually greater at the top of the gallium melt than at the bottom of the melt so the wafer tends to be thicker in those regions held at the top of the gallium melt.

SUMMARY OF THE INVENTION

This invention substantially overcomes these disadvantages of the prior art. Epitaxial layers of gallium arsenide and other III–V compounds grown in accordance with this invention possess precisely controlled thicknesses and substantially homogeneous and uniform impurity distributions. Using the technique and structure of this invention, the epitaxial growth process can be terminated at any desired time without continued uncontrolled growth due to globs of impurity-saturated, liquid gallium forming on the surface of the wafer. Moreover, the technique and structure of this invention are particularly amenable to the growth of epitaxial layers on a large number of wafers simultaneously. Automatic processing techniques are particularly useful with this invention.

According to this invention, epitaxial layers are grown on a wafer, typically a gallium arsenide wafer, by first placing the wafer in a recessed slot in the bottom of a horizontal floor of a jig. Molten gallium, containing source gallium arsenide when the wafer is gallium arsenide, is then placed in a cavity in a runner resting on the bottom of the jig. This cavity extends through the runner from its top to its bottom. Next, the jig containing the wafer and the runner is heated to a desired temperature, typically 700–800° C. When the desired temperature is reached, it is held constant for a period, typically two hours, while the source gallium arsenide goes into solution and saturates the gallium. The runner is then slid along the jig, forcing the gallium into the space on top of the wafer. The furnace temperature is then dropped at a selected rate, thereby to precipitate the semiconductor, such as gallium arsenide, out of the gallium onto the top of the underlying wafer. The semiconductor grows epitaxially on the wafer. After a selected time has elapsed, the runner is slid back off the wafer, thereby cleanly removing the gallium melt from the wafer surface. Because the runner can be slid on and off the wafer at any time, epitaxial layers can be grown to any selected thickness, from a few thousand angstroms on up to several microns or greater.

One embodiment of this invention places a second wafer in a slot on the upper inside face of the jig. As the runner is slid into the jig to place the molten gallium over the wafer in the bottom of the jig, the second wafer in the top of the jig stays in place and the gallium is forced into the space between the wafers. When the cavity directly overlies the wafer in the bottom portion of the jig, this second wafer directly overlies the melt at the top of the runner cavity, and indeed, is pressed by the heavier gallium into the slot recessed into the top of the jig. Upon removal of the runner from the jig, this wafer is held in the recess in the top of the jig. Thus in this embodiment, epitaxial layers can be grown simultaneously on two wafers.

The jig design of this invention is such that a plurality of jigs can be stacked in a furnace allowing the simultaneous growth of a large number of epitaxial layers on selected wafers. The runners can, if desired, be automatically inserted into, and withdrawn from, the corresponding jigs allowing precise control of the epitaxial growth.

DETAILED DESCRIPTION

Figure 1A:
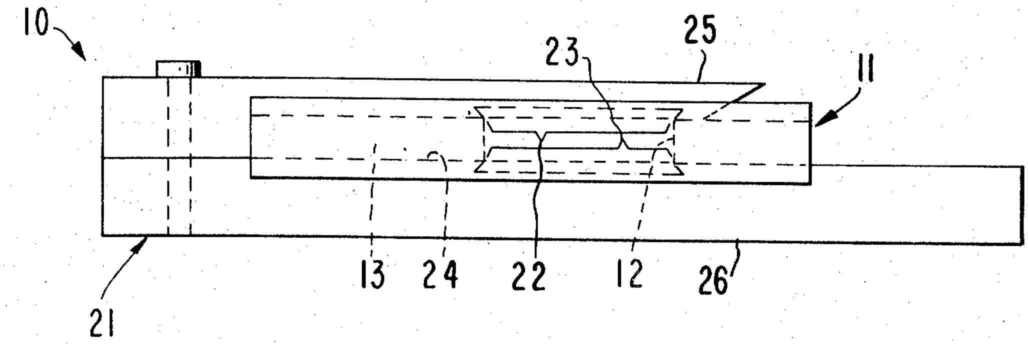
FIGS. 1*a* through 1*c* show side, top and end views of the boat of this invention.
Figure 1C:
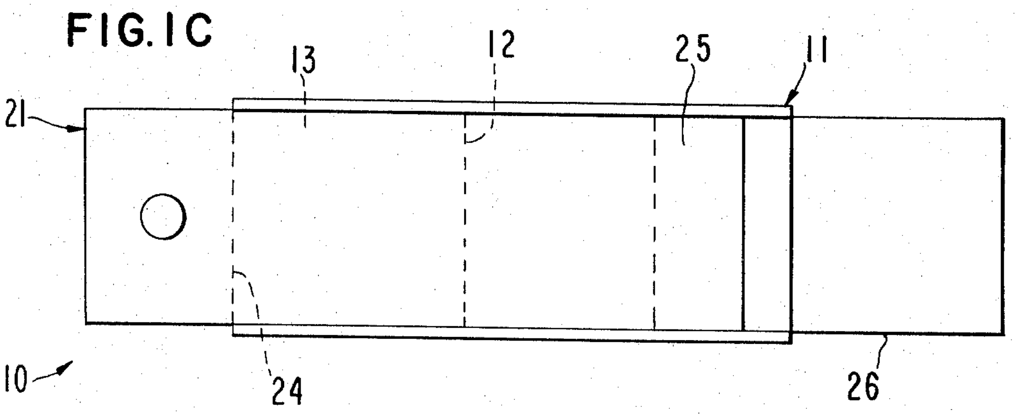
Figures 1B, 1D:
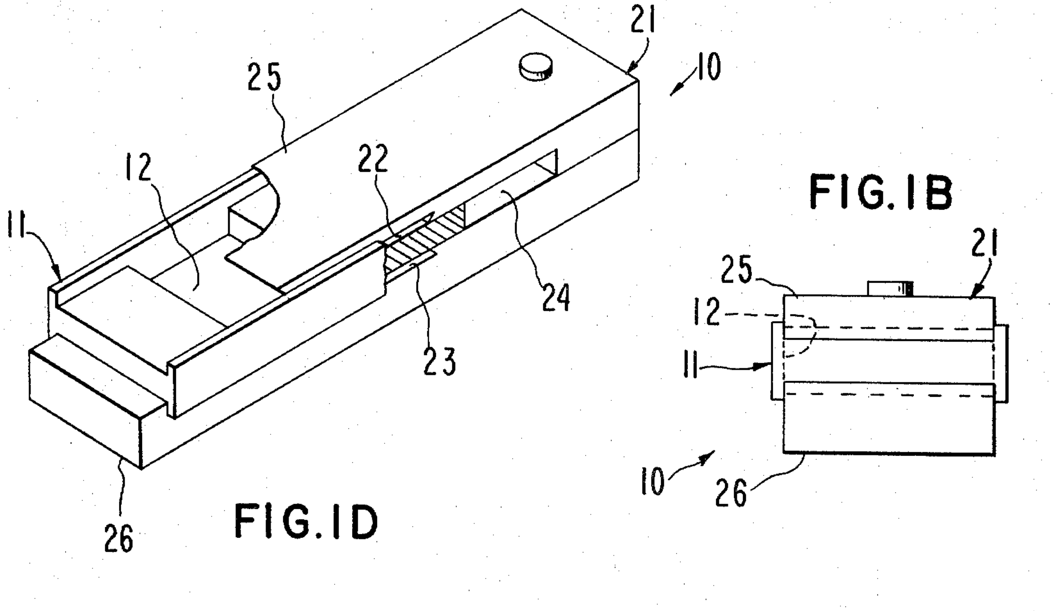
FIG. 1*d* shows an isometric, cutaway view of the boat of this invention.
Figure 2A:
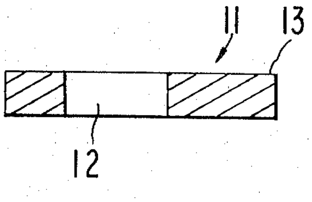
FIGS. 2*a* and 2*b* show cross-sectional, schematic, exploded views of the runner and jig of this invention.
Figure 2B:
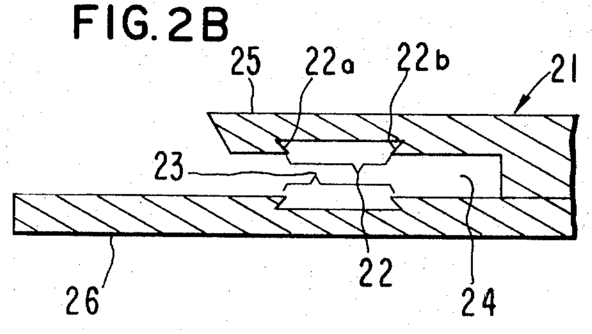

As shown in top, side, and end views in FIGS. 1*a* through 1*c*, in schematic, cross-sectional view in FIGS. 2*a* and 2*b*, and in isometric cutaway view in FIG. 1*d*, the structure of this invention consists of three pieces. Bottom piece 26 contains a recessed slot 23 for receipt of a wafer. Slot 23 faces into chamber 24 and is located directly beneath a similarly recessed slot 22 in top piece 25 of the jig. The edges of both slots 23 and 22 are undercut, as shown by those portions of FIG. 2*b* labelled 22*a* and 22*b*, to hold securely a wafer. Bottom piece 26 and top piece 25 together comprise the jig.

Figure 3:
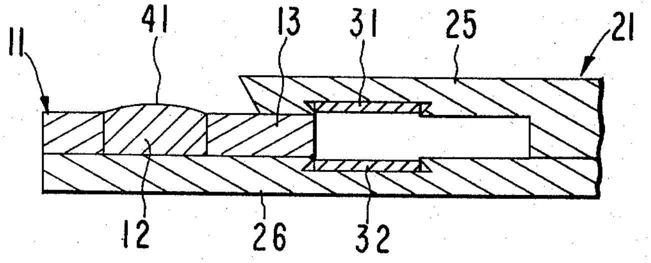
FIGS. 3 through 5 show cross-sectional schematic views of the relationship of the jig and runner during various stages of the process of this invention.

The third piece, runner 11, contains cavity 12 which extends through the runner from its top to its bottom surface. As shown in FIGS. 1*d* and 3, runner 11 rests initially on the outermost portion of bottom 26. The jig and runner together are called a "boat." A typical boat 10 is about 3.5 inches long, 0.875 inches wide, and 0.5 inches high. Bottom piece 26 and top piece 25, when joined, have a U-shaped cross-section, as shown, with bottom 26 being substantially longer than top 25.

Typically, all pieces of boat 10 are made of an inert, heat resistant material to withstand the high temperatures employed in the growth of epitaxial semiconductor layers and to minimize impurities transferred from boat 10 to the molten solution contained in cavity 12. Graphite and fused quartz are two materials suitable for use in boat 10.

The use of the structure shown in FIGS. 1*a* through 1*d* will be described in conjunction with the simultaneous growth of epitaxial layers on two wafers. The structure of this invention can alternatively be used to grow only one epitaxial layer at a time. While the process described will involve the epitaxial growth of gallium arsenide, the structure of this invention can be used to grow epitaxially other III–V compounds.

As shown schematically in FIG. 3, gallium arsenide wafer 32 is placed in recess 23 in the bottom 26 of jig 21. Gallium arsenide wafer 31 is placed in recess 22 in top 25 of jig 21. The cutaway sides of the recesses help hold these wafers in place. (For simplicity, some parts of boat 10 numbered in FIGS. 2*a* and 2*b* are not numbered in FIGS. 3 to 5.)

Figure 4:
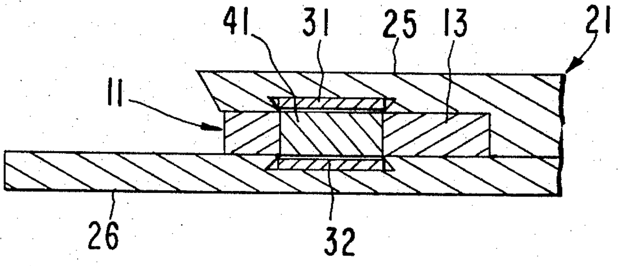

Next, melted gallium 41 is placed in cavity 12 of runner 11. A piece of gallium arsenide is also placed in cavity 12. When the gallium 41 is heated to a temperature at which the gallium arsenide contained therein is all dissolved and saturates the gallium, runner 11 is pushed into chamber 24 of jig 21, as shown in FIG. 4. Gallium arsenide is lighter than gallium. Thus gallium arsenide wafer 31 is pressed by gallium 41 up into recess 22.

When runner 11 is as far as it can go into chamber 24, gallium 41 is directly above wafer 32 FIG. 4). Because gallium 41 is saturated with gallium arsenide, a slight decrease in temperature results in gallium arsenide precipitating out of gallium 41. This precipitated gallium arsenide grows epitaxially in layers on the exposed surfaces of wafers 31 and 32. By dropping the temperature in the furnace at a selected rate, typically 10 degrees per hour, epitaxial layers are grown on the two exposed surfaces of wafers 31 and 32. The thicknesses of the resulting layers are a function of the time wafers 31 and 32 are left in contact with gallium 41.

Figure 5:
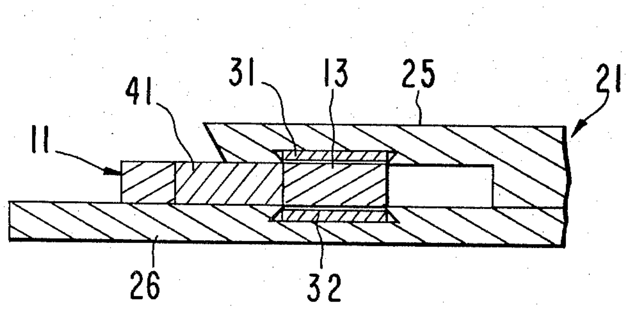

When the desired thickness epitaxial layers have been grown on wafers 31 and 32, runner 11 is removed from chamber 24 as shown in FIG. 5. Wafers 31 and 32 remain in their recessed slots during the removal of runner 11. Portion 13 of runner 11 cleans all molten gallium from the surfaces of wafers 31 and 32 during the removal of runner 11.

Figure 6:
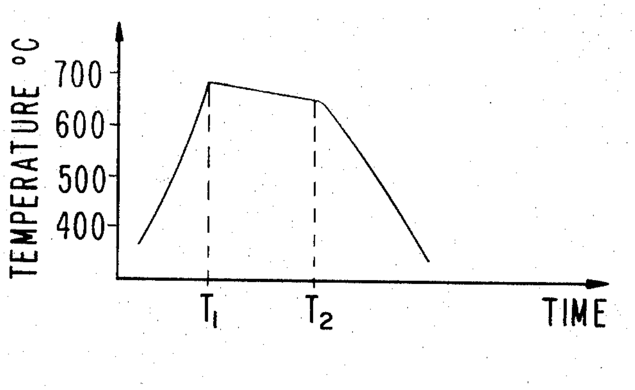
FIG. 6 shows the relationship of temperature versus time in a furnace during the epitaxial growth of a typical layer of gallium arsenide.

FIG. 6 shows a typical temperature versus time curve for the above-described process. Gallium 41 is placed in cavity 12 of runner 11 together with a source of gallium arsenide. Jig 21 and runner 11, together with gallium 41, are heated to a selected temperature, typically around 700° C. Then at time $T_1$, runner 11 is slid into chamber 24 so that gallium 41 rests over wafer 32 and under wafer 31. The temperature is then decreased at a uniform rate until time $T_2$. At this time, the desired thickness epitaxial layer has been grown. Runner 11 is then immediately drawn out of chamber 24 thereby sweeping all gallium 41 from contact with the surfaces of wafers 31 and 32. Consequently, epitaxial growth stops immediately on all portions of these surfaces.

The advantages of growing a wafer pair in the manner of this invention are numerous. First, the two wafers are located symmetrically on opposite sides of the gallium.

Hence temperature gradients parallel to the epitaxially-grown films on the two wafers are substantially reduced relative to the gradients present in the prior-art techniques. Second, the geometry of the gallium is defined by the wafer spacing rather than by surface tension, thereby resulting in better reproducibility of the epitaxially grown layers than heretofore obtainable.

Figures 8A, 8B, 8C, 8D:
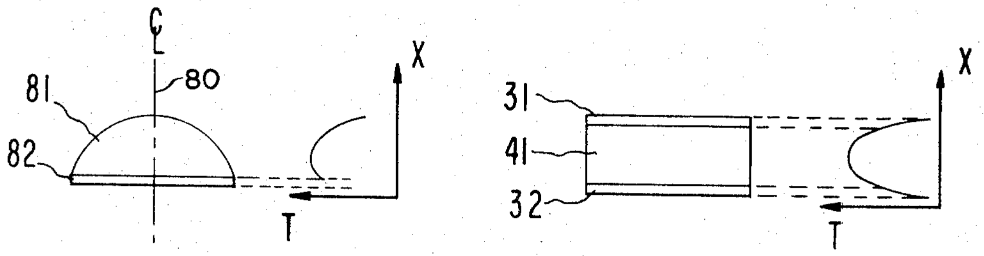
FIGS. 8*a* through 8*d* show the temperature profile in the molten gallium using the structure of this invention as compared to the gallium temperature profile using prior art methods.

The temperature profile across the molten gallium between the two wafers is close to an ideal temperature gradient as shown in FIG. 8*d*. The gallium temperature is a maximum in the middle of the gallium equidistant from the two wafers and drops as one approaches either wafer due to the slightly lower furnace temperature. The temperature gradient in the gallium using prior-art techniques is shown in FIG. 8*b*. This gradient is taken along center line 80 of the gallium wafer shown in FIG. 8*a*. Because the thickness of the gallium 81 varies with respect to the position on wafer 82 at which one measures this thickness, the temperature gradient through the gallium 81 varies with this position in order to satisfy the substantially constant temperature boundary condition at the surface of gallium 81. On the other hand, because of the uniform spacing between the two wafers placed in boat 10, as shown in FIG. 8*c*, the thickness of gallium between the two wafers is substantially uniform resulting in a substantially uniform temperature gradient throughout the gallium. This results in quite uniform growth of an epitaxial layer on the two exposed surfaces of the wafers in boat 10.

Before proceeding with the epitaxial growth process of this invention, the jigs and furnace tube must be thoroughly cleaned and outgassed. This cleaning and outgassing can be accomplished by techniques well known in the semiconductor arts. The furnace system itself must be leak tight and oxygen free to ensure growth of pure epitaxial layers. Preparation of the wafer surfaces is very important. The surfaces should be etched or chemically polished prior to epitaxial growth. The wafer surfaces must be oxide and dust free.

The molten gallium should be saturated with the source semiconductor at high temperature. If gallium arsenide is the source semiconductor, the saturation can occur at about 900° C. temperature for three to five hours. This ensures that the source gallium arsenide goes into solution and bakes out both the gallium and the gallium arsenide to volatilize trace impurities. If excess gallium arsenide is used, the baking out process need be done only once every ten to twenty runs.

Smooth epitaxially-grown layers are more easily obtained on the wafers if the gallium solution is slightly supersaturated before pushing the gallium between the wafers. Supersaturation can be achieved by rapidly dropping the furnace temperature immediately before or after insertion of runner 11 into jig 21.

Figure 7:
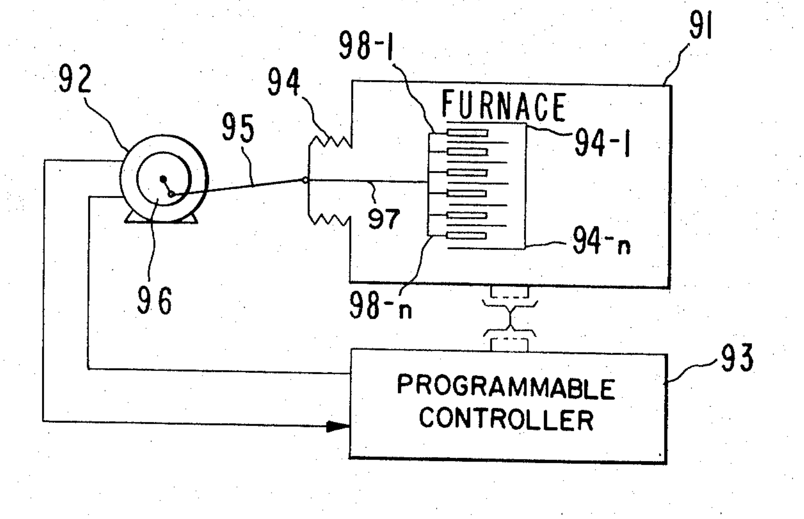
FIG. 7 shows in schematic block diagram form a system for the automatic growth of epitaxial layers on wafers.

FIG. 7 shows a structure for automatically implementing the technique of this invention. A furnace 91 contains therein a plurality 94–1 through **94–*n* of boats identical to the boat shown in FIGS. 1–6. These boats, schematically shown as stacked, each can contain one or two wafers, for example gallium arsenide wafers, upon the exposed surfaces of which are to be grown epitaxial layers of selected thicknesses. Each boat contains an associated one of runners 98–1 through 98–*n*, all runners being attached to a drive rod 97 which in turn is connected to the interior face of a steel bellows 94. Bellows 94 prevents oxygen and other contaminants from entering the furnace, while allowing rod 97 to be moved so as to drive runners 98–1 through 98–*n*** into their corresponding jigs.

A programmable controller 93 receives signals representing the temperature in furnace 91. When this temperature reaches the proper level for initiation of epitaxial growth, a signal is transmitted to motor 92. Motor 92 drives runners 98–1 through **98–*n* into their corresponding jigs by means of cam 96, rods 95 and 97, and bellows 94. Upon the elapse of a given time, programmable controller 93 sends a second signal to motor 92 indicating the completion of epitaxial growth. Motor 92 is driven so as to withdraw runners 98–1 through 98–*n*** from their corresponding jigs.

In one version of the boat 10 shown in FIGS. 1*a* through 1*d*, the bottom portions of the sides of runner 11 are angled in toward each other to occupy grooves cut in the adjoining surfaces of bottom piece 26. Thus, the sides of runner 11 grip the adjoining faces of bottom piece 26 as runner 11 slides between bottom and top pieces 26 and 25 respectively. This prevents runner 11 from lifting slightly off bottom piece 26 while being moved into and out of chamber 24.

Figure 9:
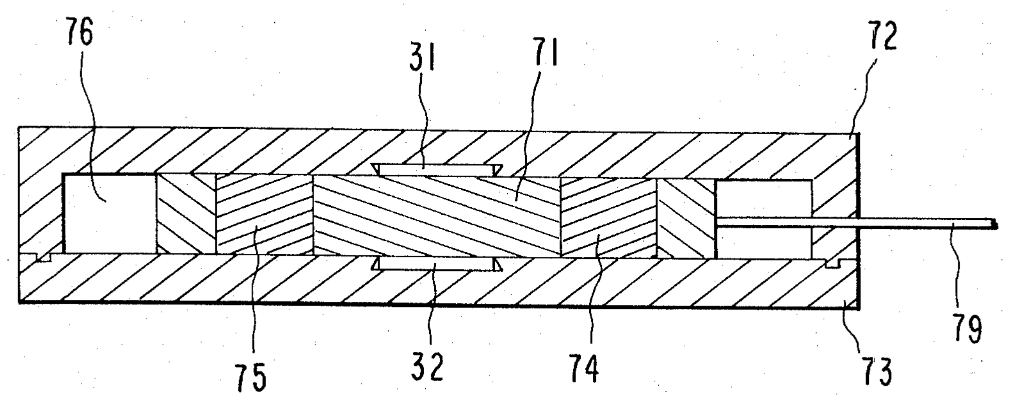
FIG. 9 shows an embodiment of this invention where the runner 71 contains two cavities.

FIG. 9 shows an embodiment of this invention in which runner 71 contains two cavities, cavities 74 and 75. The structure shown in FIG. 9 is particularly useful in growing an epitaxial layer of a first conductivity type on a wafer, and then, immediately thereafter, an additional epitaxial layer of an opposite conductivity type on the first epitaxial layer. The boat of FIG. 9 contains, as before, a top piece 72, which rests on top of, and fits into, a bottom piece 73, and a runner 71. To load cavities 74 and 75 in runner 71 with molten gallium plus source impurities and dopants, top piece 72 is removed from bottom piece 73. To grow on a gallium phosphide wafer first an N-type epitaxial layer followed immediately by a P-type epitaxial layer, gallium together with a source of gallium phosphide plus an N-type impurity such as tin or tellurium is placed in cavity 75. In cavity 74 is placed gallium together with gallium phosphide source material and a P-type impurity, such as silicon or germanium. Other P-type impurities used with III-V compounds include zinc or cadmium. However, these two impurities are not particularly suitable for this application because their high vapor pressures make it possible for their vapors to travel through the gas stream and contaminate the N-doped gallium in cavity 75.

Initially, runner 71 is pulled by means of pull rod 79 so that the molten gallium plus source material and N-type impurities in cavity 75 rest between wafers 31 and 32. After a desired thickness of an N-type gallium phosphide epitaxial layer has been grown on the exposed faces of wafers 31 and 32, runner 71 is slid back into cavity 76 such that the P-doped gallium together with gallium phosphide source material in cavity 74 rests adjacent the exposed faces of wafers 31 and 32. Epitaxial growth continues for a selected time period until the desired thickness P-type epitaxial layers have been grown on these two wafers. Then runner 71 is again slid back so that center portion of runner 71 rests adjacent wafers 31 and 32, thereby cleanly terminating the epitaxial growth process. Thus two adjacent oppositely-doped epitaxial layers are grown on each of two gallium phosphide wafers using the structure shown in FIG. 9. This structure can, of course, be used to grow such layers on a single wafer, if desired. For growing single wafers the top piece can be left off, and the wafer placed in the bottom groove. This can be done for either the double cavity design of FIG. 9, or the single cavity design of FIG. 1.

To grow gallium phosphide using the techniques of this invention, a gallium melt is saturated with phosphine, typically at 1060° C. The temperature is then dropped about 10° C. to insure that the melt is saturated or slightly super-saturated with gallium phosphide. Next, the melt is placed adjacent the surface or surfaces of one or two wafers, as shown in FIG. 2*a* through FIG. 5. The gallium temperature is then dropped at a rate between 10° C./hr. and 100° C./hr. The rate is controlled by the crystal quality desired and the type of impurity desired to be incorporated in the resulting epitaxially-grown phosphide. When the solubility of an impurity is limited in gallium phosphide, often more impurity can be placed in the gallium phosphide by growing the gallium phosphide layer at higher rates. The thickness of the epitaxially-grown gallium phosphide layer is proportional to the total temperature drop of the gallium adjacent the wafer.

Prior to placing the gallium phosphide wafer in the boat, the exposed surfaces of the wafers are chemically etched and polished. Likewise, the boat itself, together with the furnace tube, must be thoroughly cleaned and out-gassed as in the preceding discussion relating to the epitaxial growth of gallium arsenide.

The epitaxial growth of gallium phosphide and particularly of doped layers of gallium phosphide, is particularly important to achieve visible light emitting devices. To obtain the emission of green light, gallium phosphide layers are epitaxially grown with N-type impurities such as sulphur and nitrogen in a concentration of about $10^{17}$ atoms/cc. for sulphur and $10^{19}$ atoms/cc. for nitrogen. To obtain the P-type side of the junction, a zinc dopant to a concentration of $10^{17}$ to $10^{18}$ atoms/cc. is used.

To obtain red light-emitting gallium phosphide devices, an epitaxial layer of gallium phosphide containing N-type impurities such as tellurium to a concentration of $10^{18}$ atoms/cc. is first formed. An adjacent epitaxial layer containing P-type formed from zinc and oxygen to a concentration of $5 \times 10^{17}$ atoms cc. and $10^{17}$ atoms/cc. respectively, is commonly used.

It should be noted that in the green light-emitting device, both sulphur and nitrogen must be present in the N-type epitaxial gallium-phosphide layer while in the red light-emitting device, the P-type layer must have both zinc and oxygen present simultaneously.

What is claimed is:

1. The method of growing epitaxial layers of III–V compounds which comprises:

saturating a small quantity of heated molten gallium with a selected semiconductor;

forcing said saturated gallium into a space between a pair of wafers for a selected time period during which the temperature of said saturated gallium is lowered at a selected rate thereby to precipitate out said semiconductor onto the exposed surfaces of said wafers, said wafers being such that the semiconductor grows epitaxially on said wafers; and removing said saturated gallium from between said wafers after a selected time has elapsed in such a manner as to sweep the melted gallium from the surfaces of said wafers thereby to terminate cleanly said epitaxial growth.

2. The method of claim 1 wherein said semiconductor is gallium arsenide and said wafers are gallium arsenide wafers.

3. The method of claim 2 wherein said temperature is decreased at approximately 10° C. per hour.

4. The method of claim 3 wherein said gallium adjacent said pair of wafers contains gallium arsenide in an amount such that said gallium is saturated with said gallium arsenide at a temperature of 700° C.

5. The method of claim 1 wherein said semiconductor is gallium phosphide and said wafers are gallium phosphide wafers.

6. The method method of forming a first epitaxial layer of a III–V compound containing an impurity of one conductivity type adjacent a second epitaxial layer of the same III–V compound containing an impurity of opposite conductivity type, which comprises:

saturating a first quantity of heated molten gallium with phosphine and a selected concentraton of a selected impurity of said one conductivity type;

saturating a second quantity of heated molten gallium with phosphine and a selected concentration of a selected impurity of said opposite conductivity type;

forcing said first quantity of heated molten gallium into a space between a pair of wafers for a first selected time period during which the temperature of said first quantity of gallium is lowered at a first selected rate thereby to precipitate out gallium phosphide with said selected impurity of said one conductivity type contained therein onto the exposed surfaces of said wafers, with wafers being such that the gallium phosphide with said selected impurity of said one conductivity type grows epitaxially on said wafers;

removing said first quantity of heated molten gallium from between said pair of wafers in such a manner as to sweep molten gallium from the surfaces of said wafers thereby to terminate cleanly said epitaxial growth;

forcing said second quantity of heated molten gallium into the space between said pair of wafers for a second selected time period during which the temperature of said second quantity of gallium is lowered at a second selected rate thereby to precipitate out gallium phosphide with said selected impurity of said opposite conductivity type onto the exposed surfaces of said wafers, said wafers being such that the gallium phosphide with said selected impurity of said opposite conductivity type grows epitaxially on said wafers; and removing said second quantity of gallium phosphide from between said wafers after a selected time has elapsed in such a manner as to sweep molten gallium from the surfaces of said wafers thereby to terminate said epitaxial growth.

7. The method of growing epitaxial layers of III–V compounds which comprises:

saturating a small quantity of heated molten gallium with phosphine;

forcing said saturated gallium into a space between a pair of wafers for a selected time period during which the temperature of said saturated gallium is lowered at a selected rate thereby to precipitate out gallium phosphide onto the exposed surfaces of said wafers, said wafers being such that gallium phosphide grows epitaxially on said wafers; and removing said saturated gallium from between said wafers after a selected time has elapsed in such a manner as to sweep the melted gallium from the surfaces of said wafers thereby to terminate cleanly said epitaxial growth of gallium phosphide.

8. The method of claim 7 wherein said heated molten gallium is saturated with phosphine at 1,060 degrees centigrade before said saturated gallium is forced between said pair of wafers.

9. The method of claim 8 wherein the temperature of said saturated gallium is dropped at a rate between 10° C. per hour and 100° C. per hour.

10. The method of claim 7 wherein said gallium phosphide layers are epitaxially grown on the surfaces of said wafers with at least one N type impurity in a concentration between $10^{17}$ atoms per cc. and $10^{19}$ atoms per cc.

11. The method of claim 7 wherein said gallium phosphide layers are epitaxially formed on said wafers with at least one P type impurity in a concentration between $10^{17}$ atoms per cc. and $10^{18}$ atoms per cc.

References Cited

UNITED STATES PATENTS

| | | | |
|---|---|---|---|
| 3,560,276 | 2/1971 | Panish et al. | 148—171 |
| 3,533,856 | 10/1970 | Panish et al. | 148—1.5 |
| 3,558,373 | 1/1971 | Moody et al. | 148—171 |
| 3,565,702 | 2/1971 | Nelson | 148—172 |
| 3,607,463 | 9/1971 | Kinoshita et al. | 148—171 |

GEORGE T. OZAKI, Primary Examiner

U.S. Cl. X.R.

148—172; 117—201; 252—62.3 GA; 118—415